(12) United States Patent
Rodnick et al.

(10) Patent No.: US 8,954,287 B2
(45) Date of Patent: Feb. 10, 2015

(54) SYSTEMS AND METHODS FOR CALIBRATING END EFFECTOR ALIGNMENT USING AT LEAST A LIGHT SOURCE

(75) Inventors: Matt Rodnick, San Jose, CA (US); Christine Allen-Blanchette, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 423 days.

(21) Appl. No.: 12/810,780

(22) PCT Filed: Dec. 19, 2008

(86) PCT No.: PCT/US2008/087775

§ 371 (c)(1), (2), (4) Date: Jun. 25, 2010

(87) PCT Pub. No.: WO2009/086164

PCT Pub. Date: Jul. 9, 2009

(65) Prior Publication Data

US 2010/0280790 A1    Nov. 4, 2010

Related U.S. Application Data

(60) Provisional application No. 61/017,143, filed on Dec. 27, 2007, provisional application No. 61/017,146, filed on Dec. 27, 2007, provisional application No. 61/017,147, filed on Dec. 27, 2007.

(51) Int. Cl.
*G06F 15/00* (2006.01)
*G01B 11/14* (2006.01)
(Continued)

(52) U.S. Cl.
CPC ........ *H01L 21/681* (2013.01); *H01L 21/67069* (2013.01)
USPC ........................................ 702/95; 250/559.11

(58) Field of Classification Search
CPC ..................... H01L 21/681; H01L 21/67069
USPC ............ 250/370.01, 559.01, 559.11, 559.19, 250/559.29, 559.3, 559.31, 559.33, 559.35, 250/559.36; 702/33, 95, 35, 36, 40, 57, 85, 702/94, 150, 166, 167, 155; 700/56, 57, 59, 700/64, 66, 95, 117, 121, 302; 356/614, 356/623; 438/14–16
See application file for complete search history.

(56) References Cited

U.S. PATENT DOCUMENTS 4,055,376 A    10/1977  Daberko
4,819,167 A *   4/1989  Cheng et al. .................... 700/59
(Continued)

FOREIGN PATENT DOCUMENTS

CA    2305919    10/2000
EP    0462596    6/1991
(Continued)

OTHER PUBLICATIONS

"International Preliminary Report on Patentability", Issued in PCT Application No. PCT/US2008/087556; Mailing Date: Jul. 8, 2010.
(Continued)

*Primary Examiner* — Sujoy Kundu
*Assistant Examiner* — Ricky Ngon

(57) ABSTRACT

A method for calibrating alignment of an end effector with respect to a chuck in a plasma processing system is disclosed. The method includes providing a first light beam from the end effector to said chuck, moving the end effector along a predefined calibration path such that the first light beam traverses a surface of the chuck, receiving a set of reflected light signals being generated at least when the surface reflects the first light beam during the moving, and analyzing the set of reflected light signals to identify three or more discontinuities, generated when the first light beam encounters an edge of the chuck. The method also includes determining three or more coordinate data points representing three or more points on the edge of the chuck, and determining a center of the chuck based on the three or more coordinate data points.

17 Claims, 5 Drawing Sheets

(51) Int. Cl.
*H01L 21/68* (2006.01)
*H01L 21/67* (2006.01)

(56) References Cited

U.S. PATENT DOCUMENTS

| | | | |
|---|---|---|---|
| 4,971,443 A | 11/1990 | Koyagi | |
| 5,530,548 A | 6/1996 | Campbell et al. | |
| 5,675,407 A | 10/1997 | Geng | |
| 5,822,213 A | 10/1998 | Huynh | |
| 5,999,268 A | 12/1999 | Yonezawa et al. | |
| 6,094,264 A | 7/2000 | Wuyts | |
| 6,114,705 A | 9/2000 | Leavitt et al. | |
| 6,126,382 A | 10/2000 | Scales et al. | |
| 6,188,323 B1 * | 2/2001 | Rosenquist et al. | 340/686.5 |
| 6,191,851 B1 | 2/2001 | Kirkham et al. | |
| 6,195,619 B1 * | 2/2001 | Ren | 702/155 |
| 6,339,730 B1 | 1/2002 | Matsushima | |
| 6,502,054 B1 | 12/2002 | Mooring et al. | |
| 6,629,053 B1 | 9/2003 | Mooring | |
| 6,747,746 B2 | 6/2004 | Chizhov et al. | |
| 6,895,831 B2 | 5/2005 | Hunter | |
| 6,917,698 B2 | 7/2005 | Obi | |
| 6,952,255 B2 | 10/2005 | Perry et al. | |
| 7,158,280 B2 | 1/2007 | Sandstrom | |
| 7,197,828 B2 | 4/2007 | Lof et al. | |
| 7,352,440 B2 | 4/2008 | Hoogendam et al. | |
| 8,099,192 B2 * | 1/2012 | Genetti et al. | 700/254 |
| 2002/0068992 A1 * | 6/2002 | Hine et al. | 700/229 |
| 2003/0231950 A1 | 12/2003 | Raaijmakers | |
| 2004/0167743 A1 | 8/2004 | Hosek | |
| 2004/0258514 A1 | 12/2004 | Raaijmakers | |
| 2005/0102064 A1 * | 5/2005 | Donoso et al. | 700/254 |
| 2005/0137751 A1 | 6/2005 | Cox et al. | |
| 2005/0276920 A1 | 12/2005 | Kim | |
| 2006/0009047 A1 | 1/2006 | Wirth et al. | |
| 2006/0045666 A1 | 3/2006 | Harris et al. | |
| 2007/0112465 A1 | 5/2007 | Sadighi et al. | |
| 2007/0177963 A1 | 8/2007 | Tang et al. | |
| 2008/0061255 A1 | 3/2008 | Park | |
| 2008/0071408 A1 | 3/2008 | Hiroki | |
| 2012/0271590 A1 * | 10/2012 | Sakhare et al. | 702/151 |
| 2013/0056635 A1 * | 3/2013 | Kimba et al. | 250/310 |

FOREIGN PATENT DOCUMENTS

| | | |
|---|---|---|
| EP | 1 175 970 A2 | 1/2002 |
| EP | 1669808 | 6/2006 |
| JP | 2000-114347 A | 4/2000 |
| JP | 2001-210692 | 8/2001 |
| JP | 2001-230302 | 8/2001 |
| JP | 2002-313872 A | 10/2002 |
| JP | 2002-540388 | 11/2002 |
| JP | 2004-050306 A | 2/2004 |
| JP | 2004-080001 | 3/2004 |
| JP | 2004-080001 A | 3/2004 |
| JP | 2004-288792 A | 10/2004 |
| JP | 2005-068502 | 3/2005 |
| JP | 2007-501527 | 1/2007 |
| JP | 2007-037967 | 2/2007 |
| JP | 2007-324486 | 12/2007 |
| JP | 2008-251968 | 10/2008 |
| KR | 2005-0010849 A | 1/2005 |
| WO | WO-97-37376 A1 | 10/1997 |
| WO | WO-99-02996 A2 | 1/1999 |
| WO | WO-00-57127 | 9/2000 |
| WO | WO-01/78114 | 10/2001 |
| WO | WO-03/087436 | 10/2003 |
| WO | WO-2004-086465 A2 | 10/2004 |
| WO | WO-2005-028994 | 3/2005 |
| WO | WO-2005-037495 A1 | 4/2005 |

OTHER PUBLICATIONS

"International Search Report", Issued in PCT Application No. PCT/US2008/087556; Mailing Date: Aug. 7, 2009.

"Written Opinion", Issued in PCT Application No. PCT/US2008/087556; Mailing Date: Aug. 7, 2009.

"International Search Report", Issued in PCT Application No. PCT/US2008/087684; Mailing Date: Jul. 29, 2009.

"Written Opinion", Issued in PCT Application No. PCT/US2008/087684; Mailing Date: Jul. 29, 2009.

"International Preliminary Report on Patentability", Issued in PCT Application No. PCT/US2008/087684; Mailing Date: Jul. 8, 2010.

"International Search Report", Issued in PCT Application No. PCT/US2008/087775; Mailing Date: Aug. 5, 2009.

"Written Opinion", Issued in PCT Application No. PCT/US2008/087775; Mailing Date: Aug. 5, 2009.

"International Preliminary Report on Patentabiiity", Issued in PCT Application No. PCT/US2008/087775, Mailing Date: Jul. 8, 2010.

"International Search Report", Issued in PCT Application No. PCT/US2008/087578; Mailing Date: Aug. 5, 2009.

"Written Opinion", Issued in PCT Application No. PCT/US2008/087578; Mailing Date: Aug. 5, 2009.

"International Preliminary Report on Patentability", Issued in PCT Application No. PCT/US2008/087578; Mailing Date: Jul. 8, 2010.

"Hungarian Examination Report", Singapore Patent Application No. 201009526-8, Mailing Date: Dec. 2, 2011.

"Hungarian Search Report", Singapore Patent Application No. 201009526-8, Mailing Date: Dec. 2, 2011.

"Hungarian Examination Report", Singapore Patent Application No. 201004301-6, Mailing Date: Dec. 2, 2011.

"Hungarian Search Report", Singapore Patent Application No. 201004301-6, Mailing Date: Dec. 2, 2011.

"Hungarian Examination Report", Singapore Patent Application No. 201004262-0, Mailing Date: Dec. 16, 2011.

"Non Final Office Action", U.S. Appl. No. 12/810,790, Mailing Date: Sep. 20, 2012.

"Non Final Office Action", U.S. Appl. No. 12/810,777, Mailing Date: Oct. 1, 2012.

"Final Office Action", U.S. Appl. No. 12/810,790, Mailing Date: Apr. 1, 2013.

"Final Office Action", U.S. Appl. No. 12/810,777, Mailing Date: Apr. 18, 2013.

* cited by examiner

SYSTEMS AND METHODS FOR CALIBRATING END EFFECTOR ALIGNMENT USING AT LEAST A LIGHT SOURCE

PRIORITY CLAIM

This application is related to and claims priority under 35 U.S.C. §119(e) to a commonly assigned provisional patent application entitled "Optical Technique for End Effector Calibration In-Situ," by Allen-Blanchette et al., application Ser. No. 61/017,143 filed on Dec. 27, 2007, and under 35 U.S.C. 371 to a PCT Application No. PCT/US2008/087775, filed on Dec. 19, 2008, all of which are incorporated herein by reference.

BACKGROUND OF THE INVENTION

In the processing of semiconductor substrates (e.g., wafers), plasma is often employed. In plasma processing, the wafers are processed using a plasma processing system, which typically includes a plurality of processing modules. The substrate (e.g., wafer) is disposed on a chuck inside a processing module during plasma processing.

In order to move a wafer in and out of the process module, the wafer is typically placed on an end effector and transferred onto the chuck. The end effector is a structural component configured for supporting the wafer during wafer transfer. The end effector is typically disposed on a robot arm. FIG. 1 shows a representative prior art end effector 102 for supporting a wafer 104 during wafer transfer. For illustration purposes, a portion of a robot arm 106 is also shown.

Generally speaking, during a wafer transfer sequence, the robot arm first moves the end effector to pick up the wafer from a wafer storage cassette or station. Once the wafer is positioned on the end effector, the robot arm would then move the wafer into the plasma process module through a door in the processing module. The robot arm then positions the end effector and the wafer over the chuck and then places the wafer on the chuck for plasma processing.

In order to ensure that the wafer is processed properly (thereby ensuring controllable and repeatable process results), the wafer needs to be centered on the chuck during plasma processing. If the end effector is perfectly centered relative to the chuck and the wafer is perfectly centered relative to the end effector, then the wafer would be perfectly centered relative the chuck when the robot arm places the wafer on the chuck.

From the robot arm controller's perspective, it is important to know the center of the chuck to enable the robot arm controller to center the end effector over the chuck for the purpose of wafer placement. Accordingly, for any given plasma processing module, the robot arm controller needs to be taught the position of the chuck and the chuck center. In other words, the robot arm controller needs to ascertain, in its own coordinate system, the exact location of the chuck and the chuck center since each chuck may be positioned slightly differently in each processing module due to, for example, machining and/or manufacturing and/or assembly tolerances.

To compensate for the end effector/chuck mis-alignment, the typical strategy during calibration involves moving the robot arm to a position where the center defined by the end effector (herein referred to as the "end effector center" or the "end effector-defined center") actually aligns with the center of the chuck. To accomplish end effector calibration, it is necessary that the operator be able to ascertain the actual end effector/chuck alignment position. In the prior art, the alignment of the end effector-defined center to the chuck center is accomplished using a fabricated mechanical fixture which fits on the edge of the chuck or attaches to the process module interior.

The mechanical fixture has a key feature (essentially a centering protrusion for the end effector), which allows the end effector to rest right up against the key feature of the calibration fixture. Since the fixture is centered relative to the chuck, when the end effector rests against the key feature of the fixture, the end effector would be centered on the chuck. Typically, positioning the end effector against the key feature is accomplished by an operator pulling or pushing the end effector against the key feature so that the end effector rests against the key feature.

After the operator has positioned the end effector against the key feature, the operator then registers the robot arm position with the robot control system so that the robot control system can record, in the robot control's coordinate system, the position of the robot arm that achieves this actual end effector/chuck alignment.

During production, the robot arm moves the end effector to the coordinates associated with this effector/chuck alignment position. If the wafer is centered with respect to the end effector, the fact that the end effector-defined center now actually aligns with the chuck center would cause the wafer to be centered relative to the chuck when the wafer is placed by the robot arm on the chuck for wafer processing. In co-pending patent applications entitled "SYSTEMS AND METHODS FOR CALIBRATING END EFFECTOR ALIGNMENT IN A PLASMA PROCESSING SYSTEM," Ser. No. 12/810,776 and "SYSTEMS AND METHODS FOR DYNAMIC ALIGNMENT BEAM CALIBRATION", Ser. No. 12/810,777, filed on even date herewith by the inventors herein and incorporated herein by reference, techniques have been proposed to address this end effector/chuck mis-alignment.

However, there are disadvantages with the prior art technique for centering the end effector relative to the chuck for calibration purposes. First of all, there are many types of chucks and processing modules in existence. Therefore, in order to use the mechanical fixture approach to perform calibration, many different mechanical fixtures must be fabricated and stocked.

Also, affixing a physical mechanical fixture, which may have one or more hard metal edges or surfaces, on the chuck may potentially damage the chuck. Additionally, if this calibration is done in the field after some plasma cycles have been executed in the processing module (e.g., in response to a concern that the end effector may not be centered relative to the chuck following a production run), the attachment of a physical calibration fixture on the chuck may cause deposited particles on or near the chuck to flake off into the processing chamber. During the subsequent processing cycles, such particles constitute particle contamination, which is undesirable.

Additionally, because the calibration is performed at atmospheric pressure, the prior art calibration technique may not effectively duplicate the conditions that exist during production. This is because during production, components of the processing module may be placed under vacuum, causing one or more components to shift due to the pressure differential between the vacuum environment and the ambient atmosphere. Since the calibration conditions do not faithfully duplicate the production conditions, accurate calibration may not be possible.

Furthermore, if the positioning of the end effector at the end effector/chuck alignment position is performed manually (e.g., involving the operator pulling or pushing the end effector to rest up against the key feature of the mechanical fixture), there may be a shift in the robot arm position when the operator releases the robot arm to go and register this end effector/chuck alignment position with the robot arm controller. This shift may occur for many reasons, including for example the fact that the robot motors are de-energized. When the robot arm pulls away, even by a small amount that may be imperceptible to the robot operator, this shift may result in inaccuracy in the calibration process. If the calibration process is inaccurate, inaccurate wafer placement during production may occur, leading to decreased yield and an increase in the rejection and/or failure rate for the fabricated products.

SUMMARY OF INVENTION

The invention relates, in an embodiment, a method for calibrating alignment of an end effector with respect to a chuck in a plasma processing system. The method including providing a first light beam from the end effector to said chuck. The method including moving the end effector along a predefined calibration path such that the first light beam traverses a surface of the chuck. The method also includes receiving a set of reflected light signals, the set of reflected light signals being generated at least when the surface reflects the first light beam during the moving. The method including analyzing the set of reflected light signals to identify three or more discontinuities. The three or more discontinuities are related to three or more reflected light signals generated when the first light beam encounters an edge of the chuck. The method also including determining three or more coordinate data points based on the three or more discontinuities, the three or more coordinate data points representing three or more points on the edge of the chuck. The method includes determining a center of the chuck based on the three or more coordinate data points.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
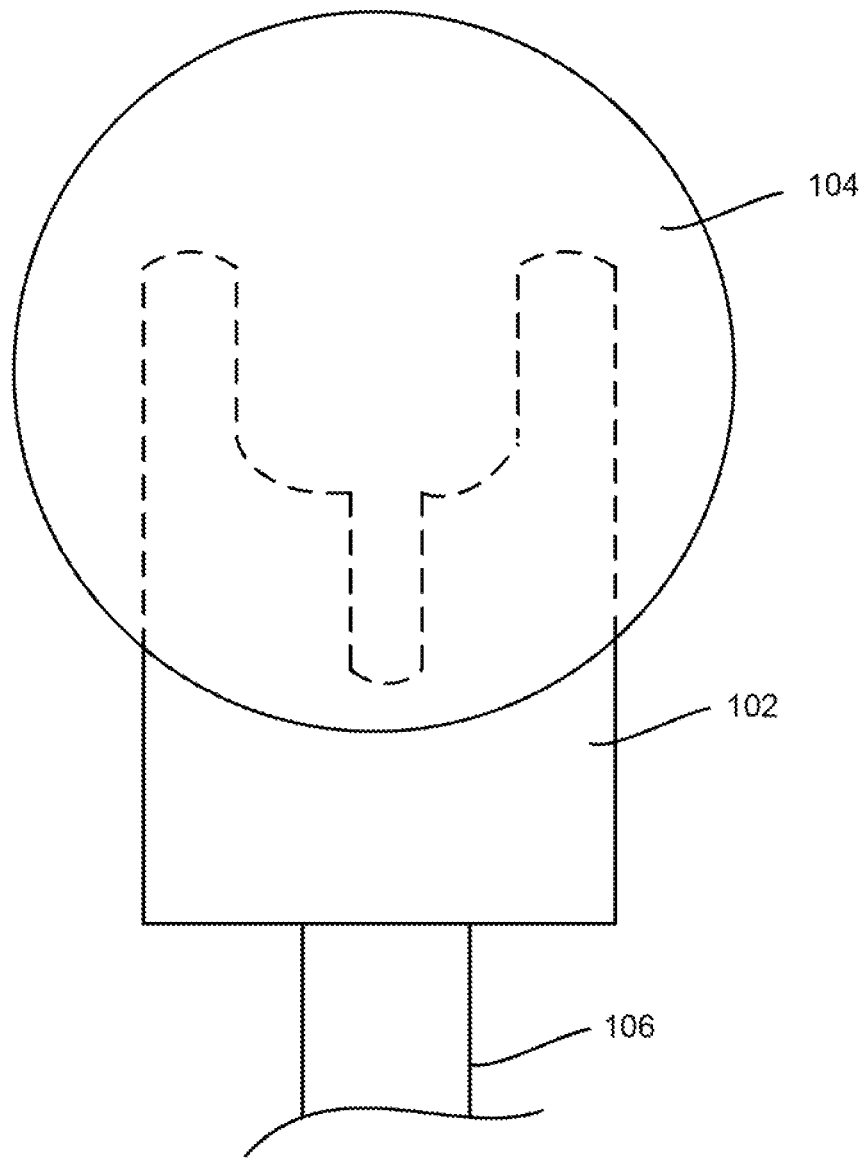
FIG. 1 shows a representative prior art end effector for supporting a wafer during wafer transfer.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to methods and apparatus for registering the center of the chuck to the robot arm controller so that the robot arm controller can ascertain, in the robot coordinate system, the position of the chuck and the chuck center in the processing module. Embodiments of the invention also relate to in-situ methods and apparatus for calibrating the vertical position of the end effector relative to the upper surface of the chuck.

In an aspect of the present invention, the inventors herein recognize that the robot arm controller typically, in its own coordinate system, the current position of the robot arm. Since the end effector is attached to the robot arm, the robot arm controller can also relate, in its own coordinate system, the current position of the end effector to the robot arm controller's own coordinate system.

In one or more embodiments of the present invention, the current position of the end effector (which position the robot arm controller can ascertain in its own coordinate system) is correlated with certain features of the chuck in order to accomplish end effector calibration. In one or more embodiments, an optical end effector alignment technique is employed in which a light source (e.g., a laser beam) is affixed to the end effector, and the end effector is sent on a predefined calibration path over the chuck in order to obtain data points pertaining to the chuck for end effector calibration.

A sensor is employed to acquire reflected light as the light beam from the light source traverses over the chuck, including the chuck's outer periphery, along the calibration path. The reflected light is analyzed for discontinuities that are indicative of the change in the reflected light as the light source encounters the chuck's outer edge. The robot arm controller correlates the occurrences of discontinuity with the robot arm coordinates at which these discontinuities occur. If three or more data points (comprising discontinuity detections and corresponding robot arm coordinates) are obtained, extrapolation logic may then be employed to extrapolate, in the robot arm controller coordinate system, the circle that represents the chuck and/or the chuck center. This extrapolation may be performed using off-the-shelf software tools such as for example the Keyence communication software for use with CV-3002 Series Controller CV-H3N, available from Keyence Corporation of Woodcliff Lake, N.J.

Having known the coordinate for the chuck center, the robot arm controller can calibrate the end effector to the chuck center. Note that with the proposed optical end effector calibration technique, the use of a specialized hardware fixture that attaches to the chuck for the purpose of centering the end effector to the chuck is no longer necessary. Accordingly, the disadvantages and risks associated with the prior art specialized hardware fixture approach are advantageously eliminated.

Further, it is not necessary to position the light source (e.g., laser source) at the end effector-defined center for the purpose of performing optical end effector calibration. In other words, the light source can be offset from the end effector-defined center, if desired. As long as the offset from the light source location on the end effector to the end effector-defined center is known, this offset may be taken into account when computing the circle that represents the chuck and/or the chuck center for the purpose of aligning the end effector-defined center to the center of the chuck or for calculating the actual movement required by the robot arm to allow the end effector to center a production wafer on the chuck. Still further, it is not necessary to position the sensor on the end effector itself. As long as there is a sensor disposed such that that sensor is capable of acquiring the sufficient reflected light for the purpose of detecting the aforementioned discontinuities, the sensor itself can be place at any desired location inside or outside of the processing module.

The features and advantages of the invention may be better understood with reference to the figures and discussions that follow.

Figure 2A:
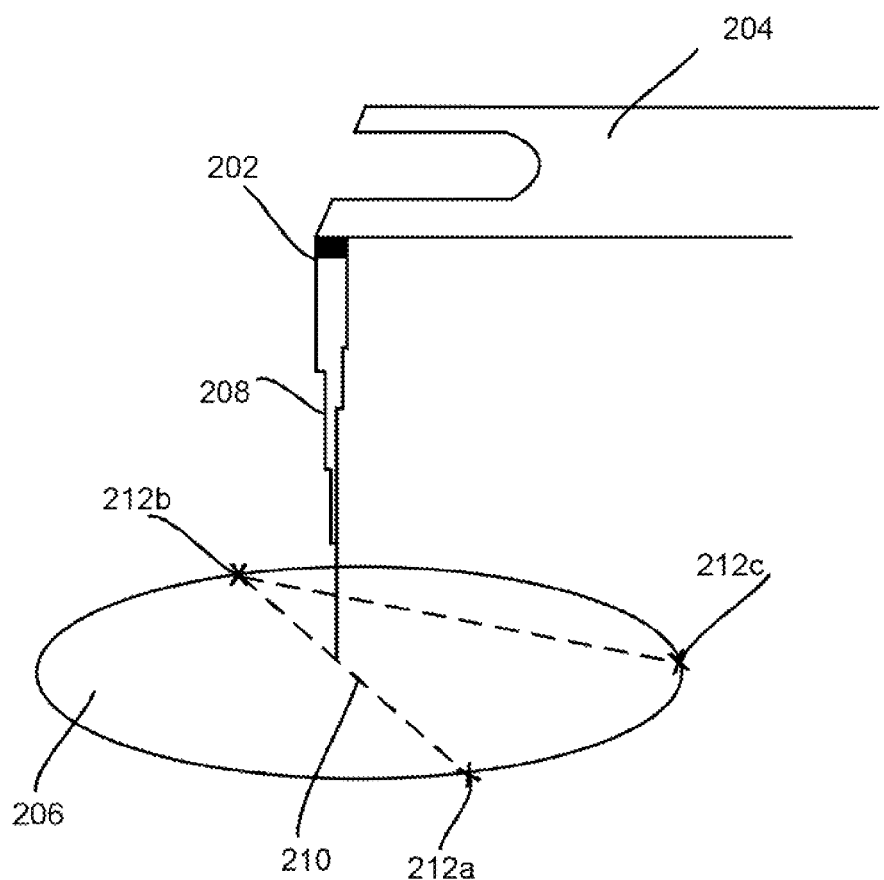
FIG. 2A shows, in accordance with an embodiment of the present invention, a portion of an in-situ optical end effector calibration arrangement for calibrating the end effector relative to the chuck center.

FIG. 2A shows, in accordance with an embodiment of the invention, a portion of an in-situ optical end effector calibration arrangement including a laser source 202 (which is integrated with a sensor in the example of FIG. 2) mounted at the tip of an end effector 204. As mentioned, for end effector calibration purposes, the light source may be disposed anywhere on the end effector as long as the offset between the light source and end effector-defined center is known.

There is also shown a chuck 206, representing a chuck mounted in the processing module of a plasma processing system. During calibration, the robot arm controller (not shown) moves the robot arm along a predefined calibration path to generate at least three chuck-edge data points. The movement of the robot arm along the calibration path causes a light beam 208 provided by laser source 202 to traverse along a path 210 as shown. In one or more embodiments, path 210 includes at least two sections, each of the two sections including at least two points on periphery 250 of chuck 206. While light beam 208 moves along path 210, the sensor records the reflected light and analyzes the reflected light for discontinuity.

As light beam 206 strikes position 212a along periphery 250 of chuck 206, a discontinuity in the reflected light is ascertained by the logic analyzing the reflected light. When the discontinuity event is detected, the robot arm controller notes its own robot arm position in its own coordinate system. As the beam moves along path 210, the beam strikes positions 212b and 212c at the chuck edge, and two additional discontinuity events are ascertained. Again, the robot arm controller correlates the ascertained discontinuities with the contemporaneous robot coordinates. After the movement of the robot arm causes light beam 208 to complete its traversal along path 210, three discontinuity points, along with their corresponding robot coordinates, are acquired.

Logic may then be employed to extrapolate the circle representing chuck 206 from the three discontinuity points. Note that since the discontinuity points are recorded in the robot coordinate system, the circle representing the chuck 206 can be readily computed in the robot coordinate system. Further, the center of the chuck 206 can also be readily computed in the robot coordinate system.

Note that path 210 may represent any arbitrary path configured to traverse the chuck's periphery at three or more locations to generate at least three discontinuity points. Generally speaking, the robot operator has a rough idea where the chuck would be located and could program, in an embodiment, the robot arm controller to move the robot arm in a manner that efficient generates widely-spaced discontinuity points to ensure that the circle representing chuck 206 can be accurately computed. An example tool to perform such calculation may be the Keyence communication software for use with CV-3002 Series Controller CV-H3N, available from Keyence Corporation of Woodcliff Lake, N.J.

Figure 2B:
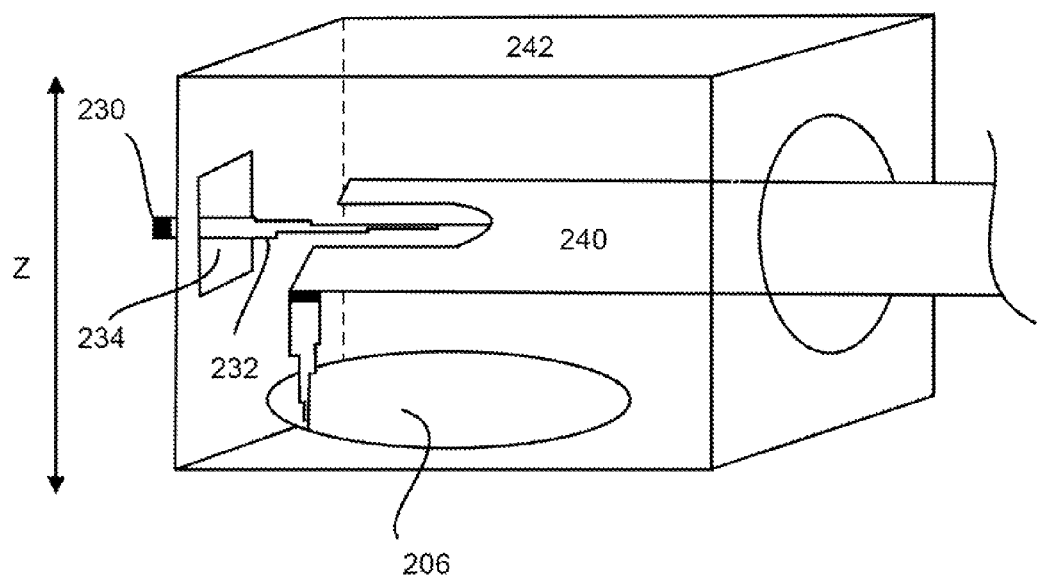
FIG. 2B shows, in accordance with an embodiment of the present invention, a portion of an in-situ optical end effector calibration arrangement for calibrating the vertical position of the end effector in-situ.

FIG. 2B shows, in accordance with an embodiment of the invention, an optical arrangement for calibrating the vertical position of the end effector relative to the upper surface of the chuck. FIG. 2B shows a light source 230 (e.g., a laser source) disposed to transmit a light beam 232 (e.g., a laser beam) through a window 234 in a wall of the processing module. Although the window is shown to be disposed on the far wall of the processing module (e.g., the wall that is opposite the door through which wafers are inserted and removed), such location is not an absolute requirement.

The height of light beam 232 may represent, in an embodiment, the desired height above chuck 206 for positioning end effector 240 during wafer transfer. A sensor (not shown) is disposed on the end effector to allow the robot control system to determine when the light beam 232 strikes end effector 240 as end effector 240 moves along a vertical calibration path (e.g., in the Z direction across beam 232).

When light beam 232 is detected by the sensor disposed at the tip of end effector 240, the robot arm controller may record, in the robot coordinate system, the contemporaneous robot arm vertical position. During wafer transfer, the recorded vertical position of the robot arm may be employed for vertically positioning the end effector.

As an alternative, light source 230 may be mounted inside processing chamber 242 and window 234 may be eliminated.

Alternatively or additionally, it is possible to analyze the reflected light from light source 232 and analyze for discontinuity in order to calibrate the vertical position of the end effector. In one or more embodiments, as the robot arm controller commands end effector 240 to move along the vertical calibration path across light beam 232, a sensor may be employed to acquired the detected light from light source 230. When light beam 232 strikes end effector 240, a discontinuity in the reflected light may be ascertained. This discontinuity may be correlated with the current coordinate of the robot arm, thereby essentially recording the robot coordinates for the vertical height of the laser beam above the chuck. When the reflected light approach is employed, it is possible to mount a sensor in any suitable location, including locations not disposed on or near end effector 240, for acquiring light reflected off light source 230.

Figure 3A:
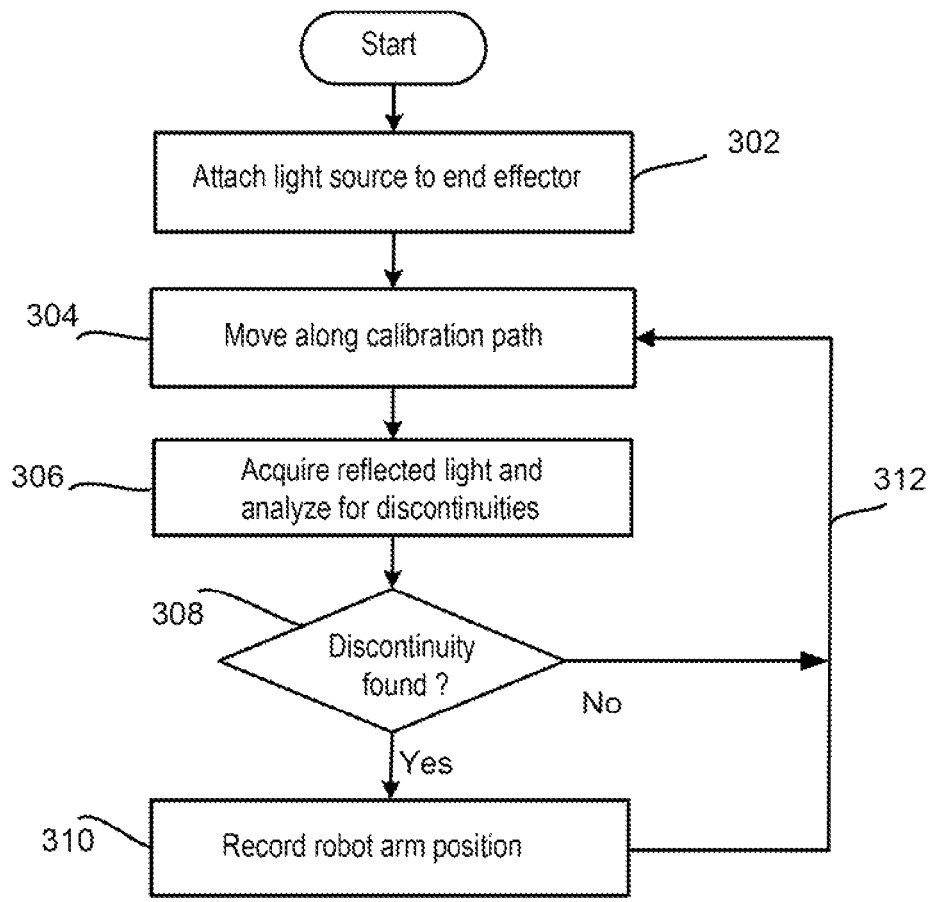
FIG. 3A shows, in accordance with an embodiment of the present invention, an illustrative flow chart for the in-situ optical end effector calibration method that calibrates the end effector to the chuck center.

FIG. 3A shows, in accordance with an embodiment of the present invention, a simplified flow chart for implementing optical end effector calibration relative to the chuck center. In step 302, a light source (such as a laser source) is attached to the end effector. In step 304, the end effector, along with the attached light source, is moved along a predefined trajectory path above the upper surface of the chuck.

During the movement of the end effector over the upper surface of the chuck, a light beam from the light source is directed at the upper surface of the chuck. The reflected light from the light source is acquired and analyzed for discontinuities (step 306). If a discontinuity is received (path "YES" of 308), the robot coordinates for the robot arm position is recorded (310). The process continues (arrow 312) until a predefined number of discontinuities and their corresponding robot arm coordinates are obtained or until the trajectory traversal is completed.

After the requisite continuity points are acquired, extrapolation logic may be employed to ascertain the chuck periphery, radius, and center. In one or more embodiments, at least three discontinuity points are desired although, depending on the trajectory defined by the robot arm controller, additional points can be obtained as well for the purpose of optical end effector calibration to the chuck center.

Figure 3B:
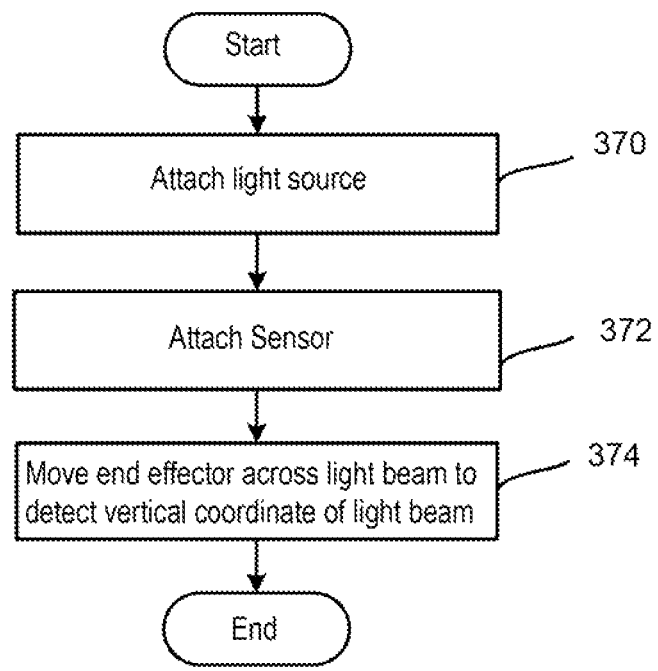
FIG. 3B shows, in accordance with an embodiment of the present invention, an illustrative flow chart for the in-situ optical end effector calibration method for calibrating the vertical position of the end effector.

FIG. 3B shows, in accordance with an embodiment of the present invention, a simplified flow chart for calibrating the vertical position of the end effector relative to the upper surface of the chuck. In the flow chart of FIG. 3B, the vertical position of a laser beam (such as laser beam 232 of FIG. 2B) is ascertained for the purpose of vertically positioning the end effector during wafer transport and/or when preparing to place the wafer on the chuck. In step 370, a light source (such as a laser source) is attached to either the inside wall of the processing module at the desired height above the chuck or outside the processing module as shown in FIG. 2B. The laser source is aimed to transmit a laser beam substantially parallelly to the upper surface of the chuck at the desired height for end effector vertical positioning.

In step 372, a sensor that is capable of sensing the laser beam is attached to the end effector and configured such that the sensor is impinged upon by the laser beam as the end effector moves along a vertical calibration path, e.g., in the Z direction (down toward the chuck and/or up away from the chuck upper surface). In step 374, the end effector, including the aforementioned sensor, is moved in the Z direction across the laser beam. If the laser beam is detected by the sensor, the contemporaneous robot coordinates for the robot arm position is recorded. This vertical position may be employed by the robot arm controller for vertically positioning the end effector during wafer transfer and/or in preparation for wafer placement on the chuck.

As can be appreciated from the foregoing, embodiments of the invention enable the robot arm controller to ascertain, in the robot coordinate system, the position of the chuck and the chuck center in any given processing module. Alternatively or additionally, the robot arm controller can also ascertain, if desired, the robot coordinates corresponding to the vertical position of the robot arm during wafer transfer.

Since the use of a specialized hardware fixture that attaches to the chuck for the purpose of centering the end effector to the chuck is no longer necessary, the disadvantages with the prior art may be avoided. For example, by performing the calibration in-situ, the conditions during production is faithfully reproduced, resulting in a more accurate calibration process. These conditions include, for example, similar vacuum conditions and similar robot servo parameters. Since a mechanical fixture is not employed, the cost associated with manufacturing and keeping a large inventory of different mechanical calibration fixtures for different plasma processing modules is eliminated.

Furthermore, the use a non-contact, non-physical calibration technique eliminates the possibility of calibration-related chuck damage and calibration-related particle contamination, making it possible to perform the calibration more frequently and/or in the middle of a production run without risking chamber and/or fabricated device damage.

Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for aligning an end effector relative to a chuck, wherein said chuck is in a plasma processing system, said method comprising:

providing a first light beam from said end effector to said chuck;

moving said end effector along a predefined calibration path such that said first light beam traverses a surface of said chuck;

receiving a set of reflected light signals at a sensor, wherein said set of reflected light signals is provided based on said first light beam reflecting off said surface during the moving of said end effector;

analyzing said set of reflected light signals to identify three or more discontinuities, wherein said three or more discontinuities are changes in three or more of said reflected light signals and occur when said first light beam encounters an outer peripheral edge of said chuck;

based on said three or more discontinuities, determining coordinates of three or more points on said outer peripheral edge of said chuck;

determining coordinates of a center of said chuck based on the coordinates of said three or more points; and aligning said end effector relative to said chuck based on said coordinates of said center of said chuck.

2. The method of claim 1, further comprising mounting a light source in a center of said end effector, wherein said light source emits said first light beam.

3. The method of claim 1, further comprising mounting a light source at a predetermined offset distance from a center of said end effector, wherein said light source emits said first light beam.

4. The method of claim 1, wherein said three or more discontinuities include four or more discontinuities.

5. The method of claim 1, further comprising:

providing said coordinates of said center of said chuck to a robot controller; and calibrating, via said robot controller, a position of said end effector to said center of said chuck.

6. The method of claim 1, wherein:
based on said coordinates of said three or more points, extrapolating a circle representing an outer periphery of said chuck; and
determining said center of said chuck based on said extrapolated circle.

7. A system for aligning an end effector relative to a chuck, wherein said chuck is in a plasma processing system, said system comprising:
a light source configured to emit a first light beam from said end effector to said chuck;
a robot arm configured to move said end effector along a first predefined calibration path such that said first light beam traverses a surface of said chuck; and
a first sensor configured to receive a set of reflected light signals, wherein said set of reflected light signals is provided based on said first light beam reflecting off said surface during the moving of said end effector;
a processor configured to
analyze said set of reflected light signals to identify three or more discontinuities, wherein said three or more discontinuities are changes in three or more of said reflected light signals and occur when said first light beam encounters an outer peripheral edge of said chuck,
based on said three or more discontinuities, determine coordinates of three or more points on said outer peripheral edge of said chuck,
determining coordinates of a center of said chuck based on the coordinates of said three or more points; and
control said robot arm to align said end effector relative to said chuck based on said coordinates of said center of said chuck.

8. The system of claim 7, wherein said light source is configured to be mounted in a center of said end effector.

9. The system of claim 7, wherein said light source is configured to be mounted a predetermined offset distance from a center of said end effect.

10. The system of claim 7, wherein at least a portion of said first sensor is implemented inside a plasma processing chamber of said plasma processing system.

11. The system of claim 7, wherein said three or more discontinuities include four or more discontinuities.

12. A system of claim 7, further comprising a second light source configured to emit a second light beam parallel to said surface of said chuck and at a predetermined height above said surface of said chuck, wherein;
said robot arm is configured to move said end effector along a second predefined calibration path;
at least one of said first sensor and a second sensor is configured to detect said second light beam as said second light beam passes over said at least one of said first sensor and said second sensor, wherein said second sensor is mounted on said end effector; and
said processor is configured to record one or more coordinates of points based on detection of said second light beam.

13. The system of claim 7, wherein said processor is configured to:
based on said coordinates of said three or more points, extrapolate a circle representing an outer periphery of said chuck; and
determine said center of said chuck based on said extrapolated circle.

14. A method for aligning an end effector relative to a chuck, wherein said chuck is in a plasma processing system, said method comprising:
emitting a first light beam parallel to an upper surface of said chuck and at a predetermined height above said upper surface of said chuck;
moving said end effector along a first predefined calibration path;
detecting said first light beam at a first sensor as said first light beam passes over said sensor due to said moving of said end effector along said first predefined calibration path, wherein said first sensor is mounted on said end effector;
recording one or more coordinates of one or more points based on detection of said first light beam;
emitting a second light beam from said end effector to said chuck;
moving said end effector along a second predefined calibration path such that said second light beam traverses said upper surface of said chuck;
receiving a set of reflected light signals at a second sensor, wherein said set of reflected light signals is provided based on said first light beam reflecting off said surface during said moving of said end effector;
analyzing said set of reflected light signals to identify three or more discontinuities, wherein said three or more discontinuities are changes in three or more of said reflected light signals and occur when said second light beam encounters an outer peripheral edge of said chuck;
based on said three or more discontinuities, determining coordinates of three or more points on said outer peripheral edge of said chuck;
determining coordinates of a center of said chuck based on said coordinates of said three or more points; and
aligning said end effector relative to said chuck based on (i) said one or more coordinates of said one or more points, and (ii) said coordinates of said center of said chuck.

15. The method of claim 14, further comprising mounting a light source on an inside wall of a processing module of said plasma processing system, wherein said light source is mounted at said predetermined height above said upper surface of said chuck, and wherein said light source emits said first light beam subsequent to being mounted on said inside wall.

16. The method of claim 14, further comprising mounting at least a portion of a light source inside a processing module of said plasma processing system, wherein said light source emits said light beam.

17. The method of claim 14, wherein:
based on said one or more coordinates of said one or more points, calibrating a vertical position of said end effector relative to said upper surface of said chuck; and
based on said center of said chuck, calibrating a horizontal position of said end effector relative to said center of said chuck.

* * * * *